United States Patent
Kawai

(10) Patent No.: US 6,284,664 B1
(45) Date of Patent: *Sep. 4, 2001

(54) SEMICONDUCTOR DEVICE, AND MANUFACTURING METHOD THEREFOR

(75) Inventor: Kenji Kawai, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/271,298

(22) Filed: Mar. 17, 1999

(30) Foreign Application Priority Data

Sep. 25, 1998 (JP) ................................. 10-271405

(51) Int. Cl.$^7$ ............................................... H01L 21/3065
(52) U.S. Cl. .................. 438/710; 438/711; 438/720; 438/721; 438/722; 438/723
(58) Field of Search .................. 438/722, 725, 438/906, 710, 711, 720, 723

(56) References Cited

U.S. PATENT DOCUMENTS

| | | | |
|---|---|---|---|
| 5,017,513 | * 5/1991 | Takeuchi | 438/688 |
| 5,100,504 | 3/1992 | Kawai et al. | 438/708 |
| 5,865,900 | * 2/1999 | Lee et al. | 134/1.2 |
| 5,895,239 | * 4/1999 | Jeng et al. | 438/239 |
| 5,902,134 | * 5/1999 | Egashira | 438/723 |

OTHER PUBLICATIONS

"Dry Post–Etch Treatment Using SF6 Chemistry for 0.2 $\mu$m Contact Hole", by Kim et al., Proceedings of Symposium on Dry Process, Nov. 10–11, 1994, The Institute of Electrical Engineers of Japan, pp. 175–179.

"Surface Studies of Reactive Ion Etch Processes", by Oehrlein, Proceedings of Syposium on Dry Process, Nov. 17–18, 1986, The Institute of Electrical Engineers of Japan, pp. 59–65.

* cited by examiner

Primary Examiner—Benjamin L. Utech
Assistant Examiner—Binh X. Tran
(74) Attorney, Agent, or Firm—McDermott, Will & Emery

(57) ABSTRACT

There is described a method of forming a semiconductor device in which a contact plug penetrates through an interlayer insulating film. The method is capable of formation of a multilayer wiring structure of small resistance. Contact holes are formed in an interlayer oxide film laid on a silicon substrate by etching, through use of a CF-based gas plasma. An organic layer deposited at the bottom of the contact holes is removed through cleaning etching through use of a plasma of a mixed gas consisting of $CF_4$ and $O_2$. After removal of the organic layer, a conductive contact plug is formed in each of the contact holes.

15 Claims, 4 Drawing Sheets

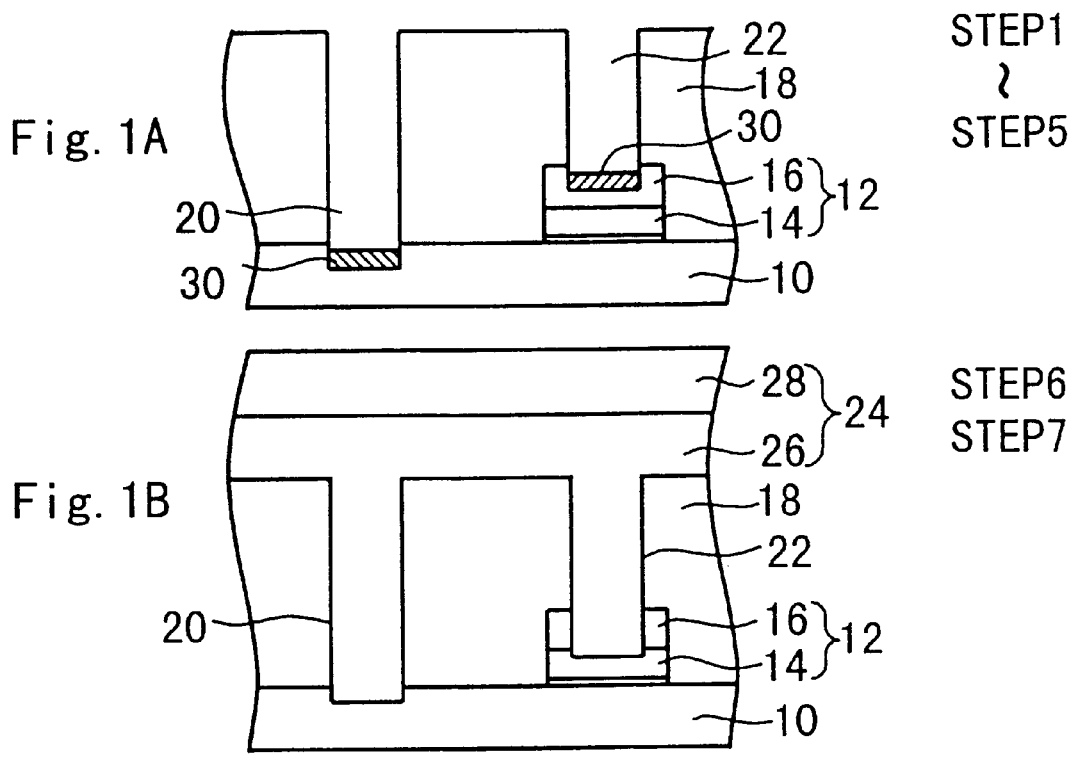
Fig. 1A
Fig. 1B
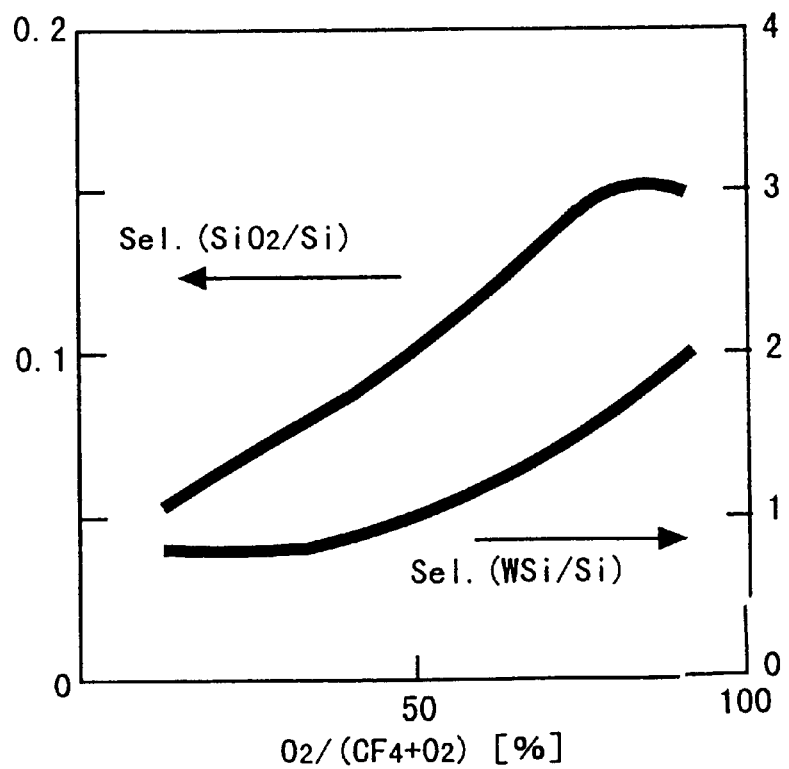
Fig. 2

STEP1
STEP2
STEP8
≀
STEP11

STEP12
(STEP12-1)

STEP12
(STEP12-2)

STEP7

STEP1
STEP13
⎱
STEP15

STEP16

STEP16

PRIOR ART
Fig. 5A
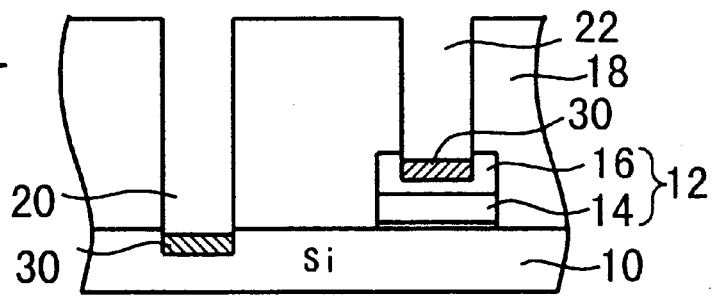
PRIOR ART
Fig. 5B
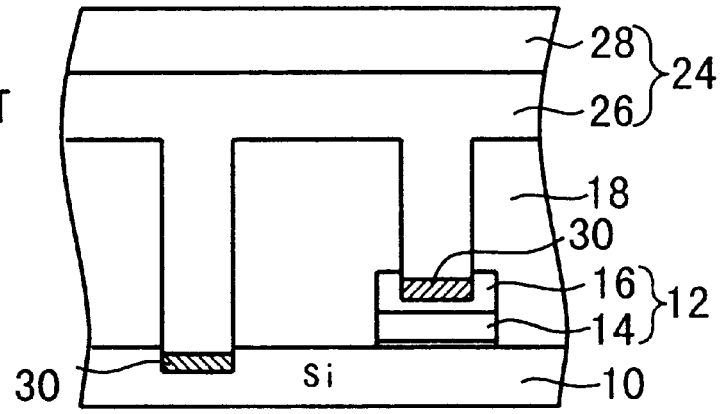
PRIOR ART
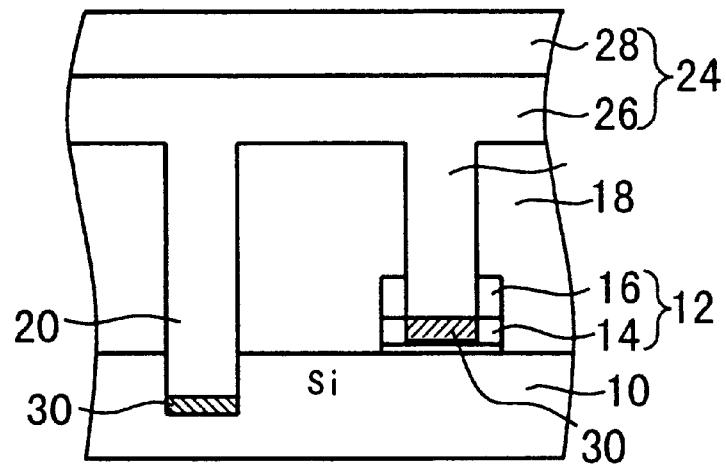
Fig. 6

SEMICONDUCTOR DEVICE, AND MANUFACTURING METHOD THEREFOR

BACKGROUND OF THE INVENTION

1. Field of the Invention

The present invention relates to a semiconductor device and a manufacturing method therefor and, more particularly, to a semiconductor device having a contact plug penetrating through an interlayer insulating film and to a method suitable for manufacturing the semiconductor device.

2. Description of the Background Art

FIGS. 5A and 5B are cross-sectional views for describing a series of processing operations in a former semiconductor device manufacturing method for forming a contact plug electrically connected to a silicon substrate or agate electrode. According to a former semiconductor device manufacturing method, a gate electrode 12 having a polycide structure is formed on a silicon substrate 10. The gate electrode 12 comprises a lower layer 14 of polycrystalline silicon and an upper lower 16 of metal silicide. The polycrystalline silicon layer 14 and the metal silicide layer 16 are usually formed to a thickness ranging from 500 to 1000 angstroms.

After formation of the gate electrode 12, an interlayer oxide film 18 is formed on the silicon substrate 10. Next, predetermined locations of the interlayer oxide film 18 are eliminated by means of photolithography and etching, thereby forming a contact hole 20 in the surface of the silicon substrate 10 and a contact hole 22 in the upper portion of the gate electrode 12 (see FIG. 5A).

After opening of the contact holes 20 and 22, a polycide wiring pattern 24 is formed (see FIG. 5B). The polycide wiring pattern 24 comprises a polycrystalline silicon layer 26 deposited in the contact holes 20 and 22 and on the interlayer oxide film 18, and a metal silicide 28 deposited on the polycrystalline silicon layer 26. The polycide structure mentioned above can reduce wiring resistance to a greater extent than can a single body of polycrystalline silicon. Accordingly, the former manufacturing method enables realization of a multilayer wiring structure of low resistance.

However, according to the former manufacturing method, the polycrystalline silicon layer 26 of the polycide wiring pattern 24 may sometimes be deposited on the metal silicide layer 16 which remains on the surface of the gate electrode 12. In this case, a contact layer of the metal silicide layer 16 and the polycrystalline silicon layer 26 (hereinafter referred to as a "silicide-silicon contact layer") is formed along aboundary between the gate electrode 12 and the polycide wiring pattern 24. Compared with a contact layer where polycrystalline silicon layers come into contact with each other (hereinafter referred to as a "silicon-silicon contact layer"), the silicon-silicide contact layer produces higher electrical resistance.

FIG. 6 is a cross-sectional view showing a semiconductor device manufactured under the condition that prevents a formation of the silicon-silicide contact layer. The semiconductor device shown in FIG. 6 can be manufactured by continually carrying out an etching operation for the purpose of forming the contact holes 20 and 22, until the contact hole 22 penetrates through the metal silicide layer 16. Under the foregoing condition, in the contact hole 22 there can be formed the contact layer of the polycrystalline silicon layer 14 of the gate electrode 12 and the polycrystalline silicon layer 26 of the polycide wiring pattern 24, i.e., the silicon-silicon contact layer. Consequently, under the foregoing condition, the resistance of the wiring pattern of the semiconductor device can be reduced.

However, if the etching operation is continued until the contact hole 22 penetrates through the metal silicide layer 16, there may arise a problem in which the silicon substrate 10 at the bottom of the contact hole 20 is eliminated excessively. For this reason, the method of preventing formation of the silicon-silicide contact layer by continually etching the contact hole 22 is not necessarily an ideal technique.

Under the former semiconductor device manufacturing method, the contact holes 20 and 22 are etched through use of a CF-based (fluorocarbon-based) gas, such as a $C_4F_8$ gas, a $CHF_3$ gas, or a $CH_2F_2$ gas. By means of the etching step in which such an etching gas is used, fluorocarbon-based polymer is deposited to a thickness of about 50 to 100 angstroms on the surface of the silicon substrate 10 in the contact hole 20 and on the surface of the gate electrode 12 in the contact hole 22. This fluorocarbon-based polymer layer will hereinafter be referred to as an "organic layer 30." If the organic layer 30 exits in the boundary surface between the polycrystalline silicon layer 26 of the polycide wiring pattern 24 and the silicon substrate 10 or the gate electrode 12, high contact resistance will develop therebetween. Even in this respect, the former manufacturing method is apt to impart high wiring resistance to the semiconductor device.

The smaller the semiconductor device, the smaller the diameter of the contact hole. Further, the smaller the diameter of the contact hole, the more apt contact resistance is to increase further. Accordingly, reduction in contact resistance and sufficient reduction in the resistance of the wiring pattern of the semiconductor device are important measures for the pursuit of miniaturization of the semiconductor device.

SUMMARY OF THE INVENTION

The present invention has been conceived to solve the previously-mentioned problems, and a general object of the present invention is to provide a novel and useful semiconductor device and a manufacturing method thereof.

A more specific object of the present invention is to provide a semiconductor device manufacturing method suitable for forming a multilayer wiring structure of low wiring resistance.

The above object of the present invention is achieved by a method of manufacturing including the steps described below. The method is suitable for manufacturing a semiconductor device having contact holes formed in an interlayer oxide film laid on both a silicon substrate and a wiring pattern. The method comprises a step of forming the contact holes by etching the interlayer oxide film through use of a CF-based gas plasma. The method includes a step for eliminating an organic layer deposited at the bottom of the contact hole, through use of a cleaning gas plasma containing a halogen-based gas selected from the group comprising $CF_4$, $Cl_2$, $CHF_3$, $SF_6$, and $NF_3$ and an oxygen containing gas selected from the group comprising $O_2$, $N_2O$, $CO_2$, $O_3$, $H_2O_2$, and $H_2O$. The method also includes a step for forming a conductive contact plug in each of the contact holes after removal of the organic layer.

A second object of the present invention is to provide a semiconductor device having a structure suitable for forming a multilayer wiring structure of low wiring resistance.

The above object of the present invention is achieved by a semiconductor device described below. The device includes a gate electrode formed on a silicon substrate. The device also includes an interlayer oxide film formed on the silicon substrate so as to cover the gate electrode. The device includes a first contact plug which penetrates through the interlayer oxide film and is electrically connected to the silicon substrate. The device includes a second contact plug which penetrates through the interlayer oxide film and is electrically connected to the gate electrode. The gate electrode has a polycide structure including a lower polycrystalline silicon layer and an upper metal silicide layer. The device further includes an interlayer film which is formed on the upper metal silicide layer and is etched at a rate higher than that at which the interlayer oxide film is etched.

Other objects and further features of the present invention will be apparent from the following detailed description when read in conjunction with the accompanying drawings.

BRIEF DESCRIPTION OF THE DRAWINGS

FIGS. 1A and 1B are cross-sectional views for describing a manufacturing method according to a first embodiment of the present invention;

FIG. 2 shows a relationship between a concentration of a cleaning gas and a selective ratio in an etching process;

FIGS. 5A and 5B are cross-sectional views for describing an example of a former manufacturing method of a semiconductor device; and FIG. 6 is a cross-sectional view for describing another example of a former manufacturing method of a semiconductor device.

DESCRIPTION OF THE PREFERRED EMBODIMENTS

Figure 3A:
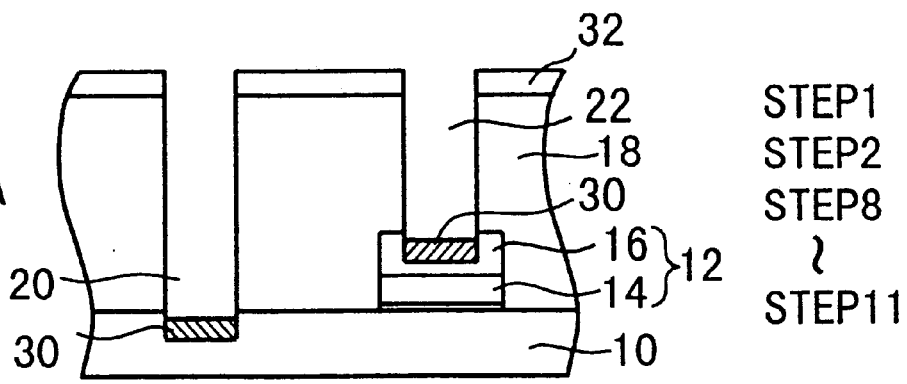
FIGS. 3A thorough 3D are cross-sectional views for describing a manufacturing method according to a second embodiment of the present invention.

In the following, principles and embodiments of the present invention will be described with reference to the accompanying drawings. The members and steps that are common to some of the drawings are given the same reference numerals and redundant descriptions therefor may be omitted.

FIGS. 1A and 1B are cross-sectional views for describing a semiconductor device manufacturing method according to a first embodiment of the present invention. According to this method, a gate electrode 12 having a polycide structure is formed on a silicon substrate 10 (step 1).

The gate electrode 12 comprises a lower layer 14 formed from a polycrystalline silicon layer and an upper layer 16 formed from a metal silicide layer. The polycrystalline silicon layer 14 and the metal silicide layer 16 are each formed to a thickness of about 500 to 1000 angstroms.

The metal silicide 16 is formed from a material selected from the group comprising, e.g., tungsten silicide, titanium silicide, molybdenum silicide, cobalt silicide, nickel silicide, ruthenium silicide, and platinum silicide. Although in the first embodiment the gate electrode 12 is formed by combination of the polycrystalline silicon layer 14 and the metal silicide layer 16, the structure of the gate electrode 12 is not limited to such a combination; alternatively, the gate electrode 12 may be formed into a metal gate structure comprising the polycrystalline silicon layer 14 and a metal film.

After formation of the gate electrode 12, an interlayer oxide film 18 is formed on the silicon substrate 10 (step 2).

A resist film in which openings are formed at predetermined locations is formed on the interlayer oxide film 18 by means of photolithography (step 3).

While the resist film is used as a mask, the substrate is exposed to an etching step for the purpose of forming the contact holes 20 and 22 (step 4). The etching step will hereinafter be referred to as an "opening etching step."

The opening etching step is carried out through use of a CF-based gas such as a $C_4F_8$ gas, a $CHF_3$ gas, or a $CH_2F_2$ gas (hereinafter referred to simply as an "opening gas"). So long as the substrate is subjected to an etching step through use of the opening gas, the interlayer oxide film 18 can be eliminated in preference to the silicon substrate 10 and the metal silicide layer 16. Accordingly, during the foregoing opening etching step, a contact hole 20 reaching the surface of the silicon substrate 10 and the contact hole 22 reaching the surface of the metal silicide layer 16 can be formed in an identical process.

Under the manufacturing method according to the first embodiment, the substrate is exposed to the opening etching step until the contact hole 20 penetrates through the interlayer oxide film 18 and reaches the surface of the silicon substrate 10 and the contact hole 22 penetrates through the interlayer oxide film 18 and reaches the surface of the metal silicide layer 16.

After formation of the contact holes 20 and 22 through the opening etching, the resist film formed on the interlayer oxide film 18 is removed (step 5) (see FIG. 1A).

During the opening etching step in which the substrate is etched through use of the opening gas, CF-based polymer, i.e., an organic layer 30, is deposited to a thickness of about 50 to 100 angstroms on the surface of the silicon substrate 10 in the contact hole 20 and on the surface of the gate electrode 12 in the contact hole 22. If a contact plug is formed on the organic layer 30 while the organic layer 30 still remains on the surface of the silicon substrate 10 and on the surface of the gate electrode 12, a high contact resistance develops in the contact layer between the contact plug and the silicon substrate 10 and in the contact layer between the contact plug and the gate electrode 12. Accordingly, elimination of the organic layer 30 before formation of the contact plug is an important measure for reducing the resistance of a wiring pattern of the semiconductor device.

The organic layer 30 can be eliminated through use of, e.g., a cleaning gas containing $CF_4$ and $O_2$ in predetermined proportions (such a mixed gas will hereinafter be designated through use of a slash symbol such as "$CF_4/O_2$ gas"). This etching step will be hereinafter be referred to as a "cleaning etching step." As a result of the silicon substrate 10 being eliminated by a thickness of about 150 angstroms in the cleaning etching step, contact resistance between the silicon substrate 10 and the contact plug can be reduced to one-tenth of that obtained when the organic layer 30 remains on the silicon substrate 10. Further, contact resistance between the gate electrode 12 and the contact plug can be reduced to two-thirds or one-half of that obtained when the organic layer 30 remains on the gate electrode 12.

Through the foregoing cleaning etching step, i.e., an etching step in which $CF_4/O_2$ gas is used, the metal silicide layer 16 can be removed from the polycrystalline silicon layer 14 without excessive removal of the silicon substrate 10.

The horizontal axis shown in FIG. 2 represents the concentration of $O_2$ in the $CF_4/O_2$ gas used in the cleaning etching step. The right-side vertical axis shown in FIG. 2 represents a Wsi (tungsten silicide) etch selective ratio with respect to Si (silicon), and the left-side vertical axis shown in FIG. 2 represents a $SiO_2$ (silicon oxide) etch selectivity with respect to Si. It is noted that the relationship shown in FIG. 2 is obtained on condition that the contact holes 20 and 22 have a diameter of about 0.25 μm.

As shown in FIG. 2, so long as the concentration of $O_2$ in the $CF_4/O_2$ gas is set to 50% or more, the WSi/Si etch selective ratio can be set so as to assume a value of one or more through the cleaning etching step that uses a $CF_4/O_2$ gas. Accordingly, as a result of the cleaning etching step, i.e., a cleaning etching step that uses a $CF_4/O_2$ gas, the metal silicide layer 16 can be removed from an upper portion of the polycrystalline silicon layer 14.

If the metal silicide layer 16 can be removed from the upper portion of the polycrystalline silicon layer 14, aboundary surface between a contact plug (formed from polycrystalline silicon) formed in the contact hole 22 and the gate electrode 12 can be taken as a silicon-silicon contact layer. In contrast, if a contact is formed in the contact hole 22 without removal of the metal silicide layer 16, the previously-described boundary surface becomes a silicide-silicon contact layer. When the silicon-silicon contact layer is compared with the silicide-silicon contact layer under the optimum conditions, the contact resistance of the silicon-silicon contact layer is reduced to about one-tenth of that of the silicide-silicon contact layer. Accordingly, so long as the metal silicide layer 16 is removed in the cleaning etching step, a wiring structure of considerably low resistance is formed on the gate electrode 12 simultaneously with removal of the organic layer 30.

As shown in FIG. 2, the WSi/Si etch selective ratio assumes a larger value with increasing concentration of $O_2$ in the cleaning gas. Consequently, in terms of efficient removal of the metal silicide layer 16 without involving removal of the silicon substrate 10, a higher concentration of $O_2$ in the cleaning gas is desirable. In contrast, as shown in FIG. 2, the higher the concentration of $O_2$ in the cleaning gas, the higher the $SiO_2/Si$ etch selectivity, thereby making the interlayer oxide film 18 apt to become etched during the course of the cleaning etching step. For these reasons, in order to limit the rate of enlargement of the contact holes 20 and 22 to within a relevant range, the concentration Of $O_2$ in the cleaning gas must be limited to a relevant value.

Under the manufacturing method according to the first embodiment, after removal of the resist film from the surface of the interlayer oxide film 18, the substrate is exposed to the cleaning etching step through use of the $CF_4/O_2$ gas whose $O_2$ concentration is adjusted to a predetermined value within a range from 50% to 90% (step 6). Provided that the $O_2$ concentration of the $CF_4/O_2$ gas is adjusted to 90% or less, that, for example, the interlayer oxide film 18 is formed from a TEOS film, and that the silicon substrate 10 is removed by a thickness of about 300 angstroms, the extent to which the contact holes 20 and 22 are enlarged can be limited to a value of less than 0.01 μm. Accordingly, the cleaning etching step enables removal of the organic layer 30 and relevant removal of the metal silicide layer 16 from the polycrystalline silicon layer 14 without involving excessive removal of the silicon substrate 10 and excessive enlargement of the contact holes 20 and 22.

After formation of the contact hole 20 reaching the silicon substrate 10 and the contact hole 22 reaching the polycrystalline silicon layer 14 by means of the cleaning etching step, a polycide wiring pattern 24 is formed (step 7) (see FIG. 1B). The polycide wiring pattern 24 comprises a polycrystalline silicon layer 26 deposited in the contact holes 20 and 22 and on the interlayer oxide film 18. Portions of the polycrystalline silicon layer 26 deposited in the contact holes 20 and 22 serve as a contact plug for establishing continuity between the silicon substrate 10 and an external wiring pattern and between the gate electrode 12 and an external wiring pattern. The polycide wiring pattern 24 further comprises a metal silicide layer 28 which is deposited on the polycrystalline silicon layer 26.

The polycrystalline silicon layer 26 of the polycide wiring pattern 24 is in contact with the silicon substrate 10 in the contact hole 20 without presence of the organic layer 30 therebetween. Similarly, the polycrystalline silicon layer 26 is in contact with the gate electrode 12 in the contact hole 22 without presence of the metal silicide layer 16 therebetween. As a result, under the manufacturing method according to the first embodiment, there can be fabricated a multilayer wiring structure in which a wiring pattern is electrically connected with a sufficiently low resistance to both the silicon substrate 10 and the gate electrode 12.

Under the manufacturing method according to the first embodiment, use of a downstream etching system or an anode-coupled parallel plate etching system is desirable. Further, in a case where an anode-coupled parallel plate etching system is used, a power density (i.e., RF power/electrode area) is desirably set to $0.65W/cm^2$ or less. With the foregoing etching system and etching conditions, a multilayer wiring structure such as that mentioned previously can be fabricated while the semiconductor device can be effectively protected from damage, which would otherwise be caused by etching.

Although in the first embodiment the $CF_4/O_2$ gas is used as a cleaning gas, the cleaning gas is not limited to this gas; an advantageous result similar to that yielded when the $CF_4/O_2$ gas is used as a cleaning gas can be yielded when there is used a mixed gas consisting of a halogen-based gas and an oxygen gas such as a $Cl_2/O_2$ gas, a vapor hydrofluoric acid/$O_2$ gas, a $CHF_3/O_2$ gas, an $SF_6/O_2$ gas, and $NF_3/O_2$ gas, or a chlorine-based gas such as $Cl_2$ gas or a $Cl_2/NF_3$ gas.

Further, even when as a cleaning gas there is used a mixed gas-which is made by substituting an oxygen containing gas such as $N_2O$, $CO_2$, $O_3$, $H_2O_2$, and $H_2O$ for an $O_2$ gas contained in one of the five types of mixed gases consisting of a halogen-based gas and an oxygen gas-is used, there can be yielded an advantageous result similar to that yielded when the $CF_4/O_2$ gas is used as a cleaning gas. Moreover, the foregoing superior advantageous result can also be yielded through use of a mixed gas which is made by adding to the foregoing various cleaning gases an $N_2$ gas or a rare gas primarily consisting of He, Ne, Ar, Kr, or Xe.

Although in the first embodiment the cleaning etching using the cleaning gas is performed for the purpose of removing both of the organic layer 30 and the metal silicide layer 16, the present invention is not limited to the embodiment; the cleaning etching step may be performed so as to eliminate one of the metal silicide layer 16 and the organic layer 30.

Second Embodiment

A second embodiment of the present invention will now be described by reference to FIGS. 3A to 3D.

As in the case with the manufacturing method of the first embodiment, under a manufacturing method according to the second embodiment, the gate electrode 12 and the interlayer oxide film 18 are formed on the polysilicon substrate 10, in this sequence (steps 1 and 2).

After formation of the interlayer oxide film 18, a cap layer 32 which contains no oxygen is formed on the interlayer oxide film 18. Here, the cap layer 32 is formed from polycrystalline silicon into a thickness of about 100 to 1000 angstroms. The first characteristic of the manufacturing method according to the second embodiment is that the cap layer 32 is formed on the interlayer oxide film 18 as described above.

On the cap layer 32, there is formed a resist film having openings at predetermined locations by means of photolithography (step 9).

While the resist film is used as a mask, an opening etching step is performed. During the opening etching step, the contact hole 20 is etched so as to penetrate through the cap layer 32 and to reach the surface of the silicon substrate 10, and the contact hole 22 is etched so as to penetrate through the cap layer 32 and to reach the surface of the gate electrode 12 (step 10). As in the case with the first embodiment, the opening etching is performed through use of a CF-based gas. Accordingly, the organic layer 30 is deposited at the bottom of each of the contact holes 20 and 22.

After formation of the contact holes 20 and 22 by means of the opening etching, the resist film is removed from the surface of the cap layer 32 (step 11) (see FIG. 3A).

Under the manufacturing method according to the second embodiment, after removal of the resist film, the substrate 10 is exposed to a cleaning etching step through use of a $CF_4/O_2$ gas whose $O_2$ concentration is adjusted to a predetermined value within the range from 60% to 90% (step 12). The second characteristic of the manufacturing method according to the second embodiment is that the substrate 10 is exposed to a cleaning etching step under the aforementioned condition while the cap layer 32 still remains on the interlayer insulating film 18. According to the foregoing cleaning etching step, as in the case with the first embodiment, the organic layer 30 is eliminated from the bottom of each of the contact holes 20 and 22 as well as the metal silicide layer 16 is removed from the gate electrode 12.

In the second embodiment, the substrate 10 is exposed to a cleaning etching step while the interlayer oxide film 18 is covered with the cap layer 32, i.e., a polycrystalline silicon layer. In a case where the substrate 10 is exposed to a cleaning etching step while the interlayer oxide film 18 is in an exposed state, oxygen contained in the interlayer oxide film 18 is supplied to the surrounding in the form of a gas during the course of the etching step. In contrast, under the second embodiment, since the interlayer oxide film 18 is covered with the oxygen-free cap film 32, oxygen is prevented from being supplied to the surrounding from an etching object. For this reason, in the second embodiment, the cleaning etching step is performed under a supply of a lesser amount of oxygen than in the first embodiment.

If the concentration of $O_2$ in the surroundings decreases during an etching process using the $CF_4/O_2$ gas, the amount of an organic deposit is apt to increase. The concentration of oxygen in the surrounding is apt to decrease in the contact holes 20 and 22; particularly, the concentration of oxygen in the surrounding is apt to decrease in the contact hole 20 which has an aspect ratio greater than that of the contact hole 22. For this reason, the organic substance is deposited in a greater amount at the bottom of the contact hole 20 than at the bottom of the contact hole 22.

Cleaning etching effectively provides a removal effect on the area where an organic substance is less likely to be deposited. For this reason, according to the second embodiment, through cleaning etching the exposed metal silicide layer 16 at the bottom of the contact hole 22 can be removed in preference to the exposed silicon substrate 10 at the bottom of the contact hole 20. Further, according to the second embodiment, the minimum concentration of $O_2$ in the $CF_4/O_2$ gas used for a cleaning etching operation is set to 60%. In short, according to the second embodiment, the minimum concentration of $O_2$ in the $CF_4/O_2$ gas is set to a value higher than that (50%) employed in the first embodiment. Under the circumstance where the interlayer oxide film 18 is covered with the cap layer 32, the previously described concentration of $O_2$ enables supply, to the bottom of the contact hole 22, of an amount of oxygen sufficient for removing the metal silicide layer 16. Thus, through the cleaning etching step employed in the second embodiment, the metal silicide layer 16 can be efficiently removed without excessive removal of the silicon substrate 10.

More specifically, during the cleaning etching step, the substrate 10 is exposed to a silicide removal step (step 12-1) through use of a $CF_4/O_2$ gas having a first oxygen concentration C1 ($60\% \leq C_1 \leq 90\%$). Next, the substrate 10 is exposed to an organic substance removal step (step 12-2) through use of a $CF_4/O_2$ gas having a second oxygen concentration C2 ($60\% \leq C_2 \leq 90\%$) which is greater than the first oxygen concentration C1. In the organic substance removal step, there can be removed the organic substance deposited during the silicide removal step on the surface of the silicon substrate 10 and the gate electrode 12 (see FIG. 3C). Thus, under the manufacturing method according to the second embodiment, in the contact holes 20 and 22 can be exposed the silicon substrate 10 and the polycrystalline silicon layer 14 of the gate electrode 12.

In the second embodiment, the cap layer 32 is set to such a thickness that it can be removed from the surface of the interlayer oxide film 18 during the course of the cleaning etching step. Accordingly, as shown in FIG. 3C, during the cleaning etching step, the cap layer 32 is removed from the surface of the interlayer oxide film 18. The thickness of the cap layer 32 is not limited to such a thickness; the cap layer 32 may be left on the surface of the interlayer oxide film 18 even after the cleaning etching step.

Figure 3B:
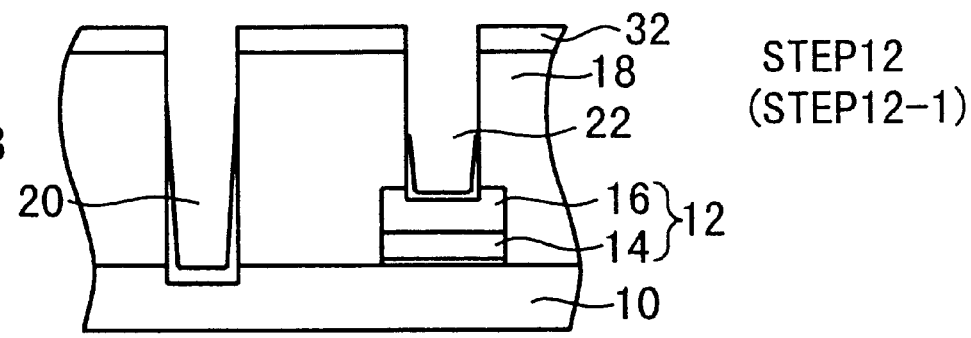
Figure 3C:
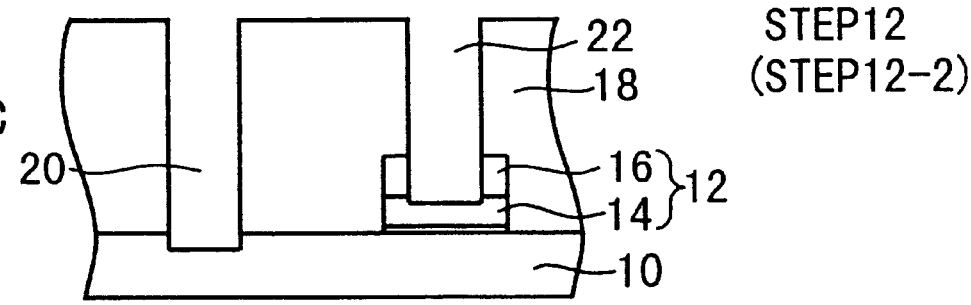
Figure 3D:
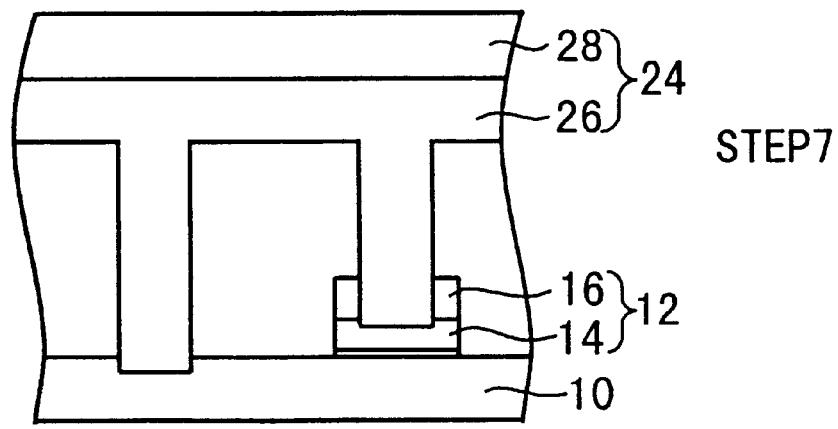

After completion of the foregoing processing, as in the case with the first embodiment, the polycide wiring pattern 24 electrically connected to the silicon substrate 10 and the gate electrode 12 is formed (step 7, FIG. 3B). The polycrystalline silicon layer 26 of the polycide wiring pattern 24 is in direct contact with the silicon substrate 10 in the contact hole 20 and is in direct contact with the gate electrode 12 in the contact hole 22. As a result, under the manufacturing method according to the second embodiment, a multilayer wiring structure of sufficient low resistance can be formed.

Although according to the second embodiment the cap layer 32 is formed from polycrystalline silicon, the material of the cap layer 32 is not limited to this substance; so long as material contains no oxygen, the cap layer 32 may be formed from any material, e.g., siliconnitride, titanium, titaniumnitride, and titanium tungsten.

Although according to the second embodiment the $CF_4/O_2$ gas is used as a cleaning gas, the cleaning gas is not limited to such a substance; as in the case with the first embodiment, there may be used as a cleaning gas a mixed gas consisting of a halogen-based gas and an oxygen-based gas, a fluorine-based gas, or a gas made by addition of either a rare gas or a $N_2$ gas to the mixed gas or the fluorine-based gas.

Third Embodiment

Figure 4A:
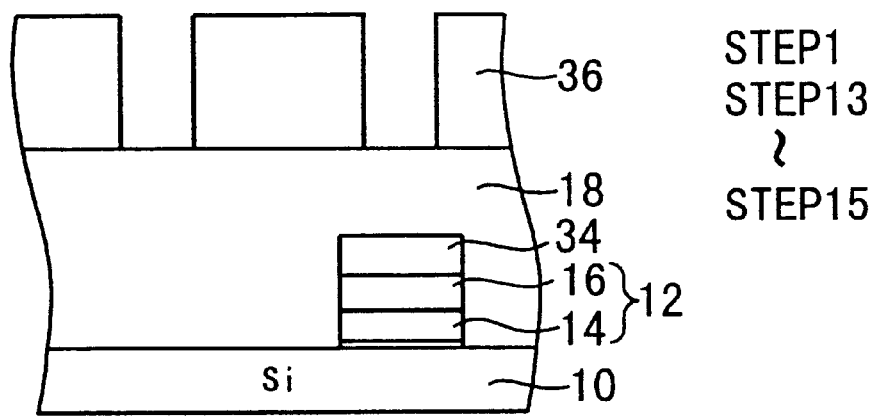
FIGS. 4A thorough 4C are cross-sectional views for describing a manufacturing method according to a third embodiment of the present invention.
Figure 4B:
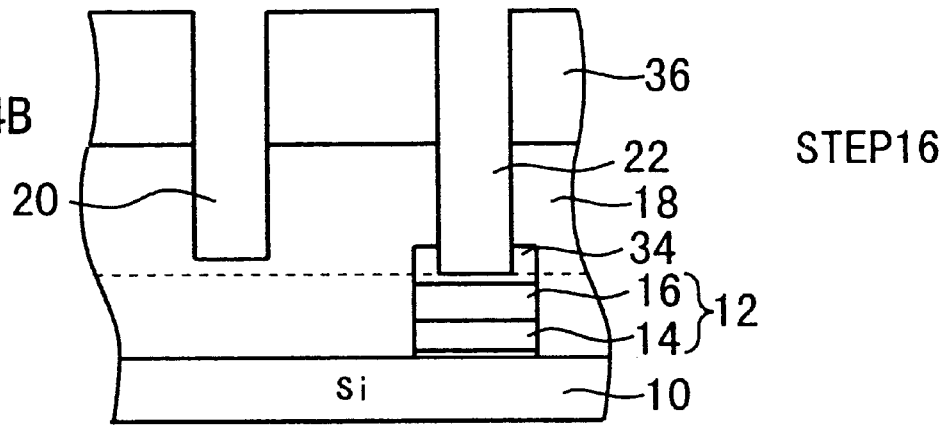
Figure 4C:
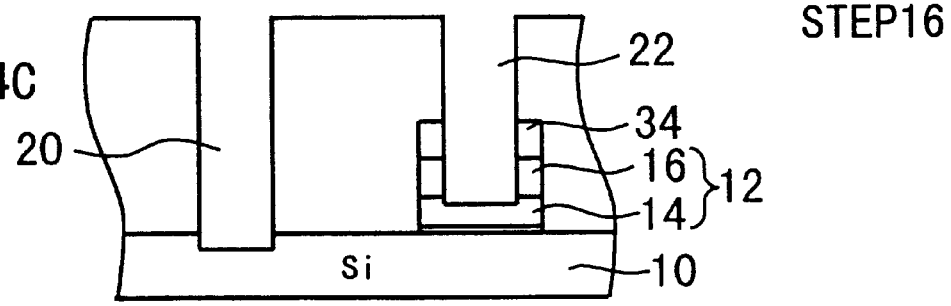

A third embodiment of the present invention will now be described by reference to FIGS. 4A through 4C.

Under the manufacturing method according to the third embodiment, as in the case with the manufacturing method according to the first embodiment, the gate electrode 12 having a polycide structure is formed on the silicon substrate 10 (step 1).

An interlayer film 34 is formed on the gate electrode 12 (step 13). According to the third embodiment, the interlayer film 34 is formed from BPTEOS. The first characteristic of the manufacturing method according to the third embodiment is that the interlayer film 34 is formed on the gate electrode 12.

After formation of the interlayer film 34, the interlayer oxide film 18 is formed on the silicon substrate 12 (step 14). According to the third embodiment, the interlayer oxide film 18 is formed from TEOS. A resist film 36 in which openings are formed at predetermined locations is formed on the interlayer oxide film 18 by means of photolithography (step 15, FIG. 3A)

While the resist film 36 is used as a mask, an opening etching is performed for forming the contact holes 20 and 22 (step 16). The opening etching is performed using a CF-based gas, as in the case with the first embodiment. During the opening etching using the CF-based gas, BPTEOS is etched at a higher rate than that at which TEOS is etched. Thus, the contact hole 22 can be formed at a higher rate in the portion right above the gate electrode 12 than that at which the contact hole 20 is formed (FIG. 3B).

If the contact hole 22 reaches the metal silicide layer 16 early, a sufficient time for etching the layer 16 can be ensured before the contact hole 20 reaches the surface of the silicon substrate 10. Accordingly, under the third embodiment, the metal silicide layer 16 can be properly eliminated without involving excessive removal of the silicon substrate 10, so long as the contact hole is etched under relevant conditions (FIG. 4C).

As in the case with the first embodiment, after completion of the foregoing processing, there is formed the polycide wiring pattern 24 electrically connected to the silicon substrate 10 and the gate electrode 12. The polycide wiring pattern 24 is in direct contact with the polycrystalline silicon layer 14 in the contact hole 22 without presence of the metal silicide layer 16 therebetween. Accordingly, under the third embodiment, there can be formed a multilayer wiring structure of sufficiently low resistance.

Although the interlayer film 34 is formed from BPTEOS in the third embodiment, the interlayer film 34 may be formed from any substance, so long as the substance ensures an etch rate higher than that at which the interlayer oxide film 18 is etched. For example, the interlayer film 34 may be formed from BPSG, PSG, or $SiO_2$ containing impurities such as B, P, or As.

Although in the third embodiment the technique employing the interlayer film 34 is used alone, the technique may be used in combination with the technique according to the first or second embodiment.

As has been mentioned above, since the present invention has the foregoing configuration, there will be yielded advantageous results such as those provided below.

According to a first aspect of the present invention, a silicon substrate is etched through use of a mixed gas consisting of a halogen-based gas and an oxygen-containing gas (e.g., a cleaning gas), thus enabling removal of an organic layer from the bottom of a contact hole.

According to a second aspect of the present invention, the silicon substrate is etched through use of a chlorine-based cleaning gas, thus enabling removal of an organic layer from the bottom of the contact hole.

According to a third aspect of the present invention, the silicon substrate is etched through use of a cleaning gas containing at least one type of gas selected from the group comprising He, Ne, Ar, Kr, Xe, and $N_2$. As a result, the organic layer deposited at the bottom of the contact hole can be eliminated.

According to a fourth aspect of the present invention, through use of a CF-based gas, contact holes can be simultaneously formed in the area above the silicon substrate and the area above the gate electrode. Further, the silicon substrate is exposed to an etching step, through use of a cleaning gas containing a halogen-based gas and the oxygen-containing gas in predetermined proportion or a cleaning gas containing $Cl_2$ and $NF_3$ in predetermined proportions. As a result, the organic layer deposited at the bottom of the contact hole is removed, and the metal silicide layer can be removed from the gate electrode in preference to the silicon substrate. The foregoing etching step enables formation of a contact hole reaching the surface of the silicon substrate and formation of a contact hole reaching the polycrystalline silicon layer of the gate electrode without involving excessive removal of the silicon substrate. According to the present invention, there can be formed a multilayer wiring structure in which a wiring pattern is electrically connected to both the silicon substrate and the gate electrode and has low resistance.

According to a fifth aspect of the present invention, after formation of the contact hole in the interlayer oxide film, the contact hole is etched through use of a cleaning gas which contains $CF_4$ and $O_2$ and is adjusted to have an oxygen concentration of from 50% to 90%. Through the foregoing etching step, the metal silicide layer can be removed from the gate electrode in preference to the silicon substrate. Further, during the etching step, excessive removal of the interlayer oxide film, i.e., excessive enlargement of the contact hole, can be prevented.

According to a sixth aspect of the present invention, the substrate 10 is exposed to an etching step through use of a cleaning gas while the surface of the interlayer oxide film is covered with the cap film. If an etching effect is exerted on the interlayer oxide film, oxygen contained in the interlayer oxide film is gasified and is supplied to the surrounding. In contrast, in a case where the surface of the interlayer oxide film is covered with an oxygen-free cap film, as in the case with the present invention, oxygen is prevented from being supplied to the surrounding from the interlayer oxide film or the cap layer during the course of etching.

During the course of the etching step employing the cleaning gas, if the concentration of oxygen in the surrounding is low, an organic substance becomes apt to be deposited in the vicinity of the bottom of the contact hole. Further, such a phenomenon becomes more noticeable as the aspect ratio of the contact hole increases. Therefore, in the vicinity of the bottom of the contact hole connected to the silicon substrate there is deposited an organic substance in an amount greater than that in the vicinity of the bottom of the contact hole connected to the gate electrode.

Therefore, during the course of the etching step employing a cleaning gas, the metal silicide layer on the gate electrode becomes more apt to be etched than is the silicon substrate. Consequently, according to the present invention, a contact hole penetrating through the metal silicide layer can be formed without excessive removal of the silicon substrate.

According to a seventh aspect of the present invention, the substrate 10 is exposed to an etching step through use of a cleaning gas which contains $CF_4$ and $O_2$ and is adjusted to have an oxygen concentration of 60% to 90%. Through the foregoing etching step, while the surface of the interlayer oxide film is covered with the cap film, the metal silicide layer can be removed from the gate electrode without involving excessive removal of the silicon substrate. Further, during the etching step, excessive enlargement of the contact hole can be prevented.

According to an eighth aspect of the present invention, after etching of the substrate 10 through use of the cleaning gas containing a first concentration of oxygen, the substrate 10 can be further exposed to an etching step through use of a cleaning gas containing a second concentration of oxygen (i.e., the first oxygen concentration<the second oxygen concentration). According to the latter etching step, the surface of the silicon substrate and the surface of the gate electrode can be exposed by removal of the organic substance still remaining at the bottom of the contact hole.

According to a ninth aspect of the present invention, an interlayer film which is etched at a high rate can be formed on the metal silicide layer of the gate electrode. For this reason, according to the present invention, during the etching of the interlayer oxide film for formation of contact holes, the contact hole located above the gate electrode can be etched at a rate higher than that at which the contact hole located above the silicon substrate is etched. For this reason, according to the present invention, a contact hole reaching a polycrystalline silicon layer of the gate electrode can be formed without excessively eliminating the silicon substrate exposed in another contact hole.

According to a tenth aspect of the present invention, in a case where the substrate 10 is subjected to an etching step for the purpose of forming a contact hole so as to penetrate to an upper portion of the gate electrode and another contact hole so as to penetrate to an upper portion of the silicon substrate, the contact hole above the gate electrode can be etched at a rate higher than that at which the contact hole located above the silicon substrate is etched. For this reason, according to the present invention, a multilayer wiring structure of low resistance can be readily formed without involving excessive removal of the silicon substrate.

According to an eleventh aspect of the present invention, a contact hole can be formed in the area above the gate electrode so as to penetrate through the metal silicide layer and the interlayer film. For this reason, according to the present invention, a multilayer wiring structure of low resistance can be formed in the area above the gate electrode.

The major benefits of the present invention described above are summarized as follows:

Further, the present invention is not limited to these embodiments, but variations and modifications may be made without departing from the scope of the present invention.

The entire disclosure of Japanese Patent Application No. Hei 10-271405 filed on Sep. 25, 1998 including specification, claims, drawings and summary are incorporated herein by reference in its entirety.

What is claimed is:

1. A method of manufacturing a semiconductor device having a plurality of contact holes formed in an interlayer oxide film laid on both a silicon substrate and a conductive wiring pattern, the method comprising the steps of:

etching the interlayer oxide film with a CF based gas plasma to expose portions of the conductive wiring pattern, thereby forming the plurality of contact holes;

eliminating an organic layer deposited at the bottom of the contact holes with a cleaning gas plasma containing a halogen-based gas selected from the group consisting of $CF_4$, $Cl_2$, $CHF_3$, $SF_6$ and $NF_3$ and an oxygen containing gas selected from the group consisting of $O_2$, $N_2O$, $CO_2$, $O_3$, $H_2O_2$ and $H_2O$; and forming a conductive contact plug in each of the contact holes after removal of the organic layer.

2. The semiconductor device manufacturing method according to claim 1, wherein the cleaning gas contains at least one type of gas selected from the group consisting of He, Ne, Ar, Kr, Xe, and $N_2$.

3. The semiconductor device manufacturing method according to claim 1, further comprising:

a step for forming on the silicon substrate a gate electrode from polycide so as to have a lower polycrystalline silicon layer and an upper metal silicide layer, wherein the interlayer insulating film is formed in an area including the gate electrode after formation of the gate electrode;

the interlayer oxide film is etched through use of the CF-based gas plasma in such a way as to form contact holes in both an area above the silicon substrate and an area above the gate electrode;

the cleaning gas corresponding to a gas containing the halogen-based gas and the oxygen-containing gas in proportions selected such that the metal silicide layer is removed in preference to the silicon substrate by means of etching through use of the cleaning gas plasma; and a contact plug corresponding to the gate electrode is formed on the polycrystalline silicon layer after removal of the metal silicide layer from the inside of the contact hole.

4. The semiconductor device manufacturing method according to claim 3, wherein the cleaning gas contains $CF_4$ as a halogen-based gas and $O_2$ gas as an oxygen-containing gas; and the concentration of $O_2$ in the cleaning gas is 50% to 90%.

5. The semiconductor device manufacturing method according to claim 3, further comprising a step of forming on the gate electrode an interlayer film which is etched at a rate higher than that at which the interlayer oxide film is etched; and wherein the etching of the interlayer oxide film through use of the CF-based gas plasma is carried out in such a way as to form a contact hole in an area above the silicon substrate and to form a contact hole which penetrates through the interlayer oxide film in an area above the gate electrode.

6. The semiconductor device manufacturing method according to claim 3, further comprising the steps of:

forming a cap film containing no oxygen on the surface of the interlayer oxide film; and the interlayer oxide film is etched through use of the cleaning gas after formation of the cap film.

7. The semiconductor device manufacturing method according to claim 6, further comprising a step of forming on the gate electrode an interlayer film which is etched at a rate higher than that at which the interlayer oxide film is etched; and wherein the etching of the interlayer oxide film through use of the CF-based gas plasma is carried out in such a way as to form a contact hole in an area above the silicon substrate and to form a contact hole which penetrates through the interlayer oxide film in an area above the gate electrode.

8. The semiconductor device manufacturing method according to claim 6, wherein the cleaning gas contains $CF_4$ as a halogen-based gas and $O_2$ as an oxygen-containing gas; and the concentration of $O_2$ in the cleaning gas is 60% to 90%.

9. The semiconductor device manufacturing method according to claim 8, wherein the step of etching the interlayer oxide film through use of the cleaning gas plasma comprises a silicide removal step carried out in a first oxygen concentration; and an organic substance removal step carried out in a second oxygen concentration which is higher than the first oxygen concentration.

10. A method for manufacturing a semiconductor device having a plurality of contact holes formed in an interlayer oxide film laid on both a silicon substrate and a conductive wiring pattern the method comprising the steps of:

etching the interlayer oxide film with a CF-based gas plasma to expose portions of the conductive wiring pattern, thereby forming the plurality of contact holes;

removing an organic layer deposited at the bottom of the contact holes with a cleaning gas plasma containing $Cl_2$ or $Cl_2$ and $NF_3$; and forming a conductive contact plug in each of the contact holes after removal of the organic layer.

11. The semiconductor device manufacturing method according to claim 10, wherein the cleaning gas contains at least one type of gas selected from the group consisting of He, Ne, Ar, Kr, Xe, and $N_2$.

12. The semiconductor device manufacturing method according to claim 10, further comprising:

a step for forming on the silicon substrate a gate electrode from polycide so as to have a lower polycrystalline silicon layer and an upper metal silicide layer, wherein the interlayer oxide film is formed in an area including the gate electrode after formation of the gate electrode;

the interlayer oxide film is etched through use of the CF-based gas plasma in such a way as to form contact holes in both an area above the silicon substrate and an area above the gate electrode;

the cleaning gas corresponding to a gas containing the halogen-based gas and the oxygen-containing gas in proportions selected such that the metal silicide layer is removed in preference to the silicon substrate by means of etching through use of the cleaning gas plasma; and a contact plug corresponding to the gate electrode is formed on the polycrystalline silicon layer after removal of the metal silicide layer from the inside of the contact hole.

13. The semiconductor device manufacturing method according to claim 12, further comprising a step of forming on the gate electrode an interlayer film which is etched at a rate higher than that at which the interlayer oxide film is etched; and wherein the etching of the interlayer oxide film through use of the CF-based gas plasma is carried out in such a way as to form a contact hole in an area above the silicon substrate and to form a contact hole which penetrates through the interlayer oxide film in an area above the gate electrode.

14. The semiconductor device manufacturing method according to claim 12, further comprising the steps of:

forming a cap film containing no oxygen on the surface of the interlayer oxide film; and the interlayer oxide film is etched through use of the cleaning gas after formation of the cap film.

15. The semiconductor device manufacturing method according to claim 14, further comprising a step of forming on the gate electrode an interlayer film which is etched at a rate higher than that at which the interlayer oxide film is etched; and wherein the etching of the interlayer oxide film through use of the CF-based gas plasma is carried out in such a way as to form a contact hole in an area above the silicon substrate and to form a contact hole which penetrates through the interlayer oxide film in an area above the gate electrode.

* * * * *